United States Patent [19]

Faraci

[11] Patent Number: 4,985,870
[45] Date of Patent: Jan. 15, 1991

[54] APPARATUS FOR CONNECTING ELECTRONIC MODULES CONTAINING INTEGRATED CIRCUITS AND BACKUP BATTERIES

[75] Inventor: Anthony B. Faraci, The Colony, Tex.

[73] Assignee: Dallas Semiconductor Corporation, Dallas, Tex.

[21] Appl. No.: 290,825

[22] Filed: Dec. 22, 1988

Related U.S. Application Data

[63] Continuation of Ser. No. 881,137, Jul. 2, 1986, abandoned.

[51] Int. Cl.$^5$ .......................... G11C 5/06; G11C 8/00
[52] U.S. Cl. ..................................... 365/228; 365/226;
365/229; 439/60; 439/61; 439/62
[58] Field of Search ............... 365/229, 228, 227, 226, 365/63; 339/17 L, 17 LM; 439/59, 60, 61, 62

[56] References Cited

U.S. PATENT DOCUMENTS

| | | | |
|---|---|---|---|
| 4,539,660 | 9/1985 | Miyauchi et al. | 365/229 |
| 4,579,406 | 4/1986 | Laursen et al. | 439/62 |
| 4,607,351 | 8/1986 | Gerber et al. | 365/228 |
| 4,628,457 | 12/1986 | Manduley | 365/229 |
| 4,645,943 | 2/1987 | Smith | 365/229 |
| 4,650,933 | 3/1987 | Benda et al. | 439/60 |
| 4,654,829 | 3/1987 | Jiang | 307/150 |
| 4,672,586 | 6/1987 | Shimohigashi et al. | 365/229 |

FOREIGN PATENT DOCUMENTS

| | | | |
|---|---|---|---|
| 60-105024 | 10/1985 | Japan | 365/229 |
| 2126021A | 3/1984 | United Kingdom | 439/60 |

OTHER PUBLICATIONS

IBM Technical Disclosure Bulletin, vol. 27, No. 11, Apr. 1985, "Chip-Enable Circuit for Battery Back-Up CMOS RAM".

Primary Examiner—Terrell W. Fears
Assistant Examiner—Melissa J. Koval
Attorney, Agent, or Firm—Worsham, Forsythe, Sampels & Wooldridge

[57] ABSTRACT

Apparatus for connecting a data storage module to an external circuit. A power supply terminal is connected between the module and the external circiut before signal terminals are connected. Apparatus includes a printed circuit board male card edge connector having selected card edge pins that extend farther than other card edge pins.

11 Claims, 1 Drawing Sheet

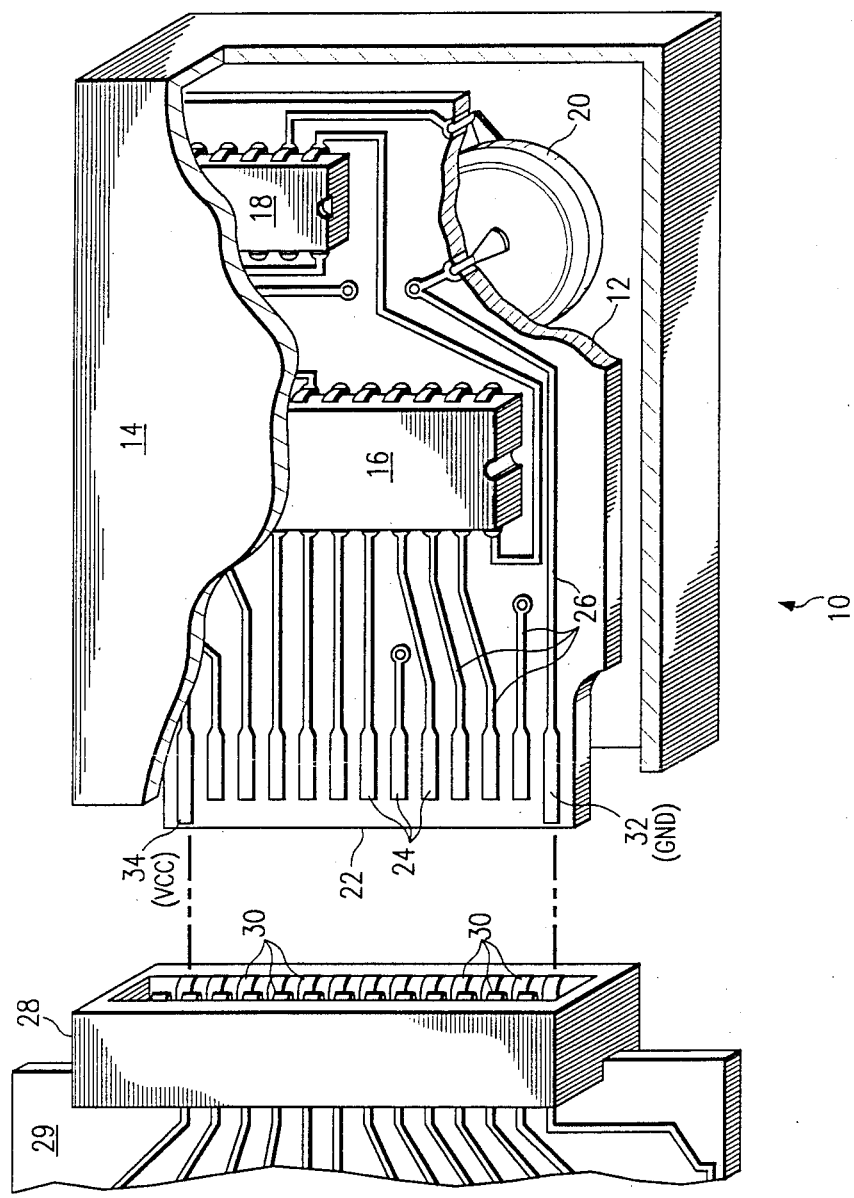

APPARATUS FOR CONNECTING ELECTRONIC MODULES CONTAINING INTEGRATED CIRCUITS AND BACKUP BATTERIES

This is a continuation of application Ser. No. 881,137, now abandoned, filed 7/2/86.

TECHNICAL FIELD

This invention relates to integrated circuits with power backup batteries and more particularly to electrical connection apparatus and methods for modules containing the integrated circuits and backup batteries.

BACKGROUND OF THE INVENTION

Semiconductor memories, as first developed, were inherently volatile (i.e., would not retain the stored data if power was removed), and various methods have been developed to either make the devices nonvolatile or to add backup batteries to the circuitry attached to the integrated circuit. In particular, one method of adding backup batteries has been to package one or two lithium batteries in the same housing with an otherwise volatile semiconductor memory to make the memory operate as a nonvolatile memory. Small lithium batteries have been developed in the last few years, and accelerated life tests have indicated that, under a relatively light electrical load, the battery should provide voltage sufficient to retain data in a semiconductor memory for well over ten years if the battery is operated at room temperature.

Such nonvolatile data storage makes it possible to utilize a transportable electronic data storage module which can be connected to an external circuit and be written into, be disconnected from the external circuit with no power applied to the module, and later be reconnected to the same or another external circuit, and have its data read out.

However, it has been discovered that this process is unreliable in that some of the data is lost on an intermittent basis, and also, at times, the life of the lithium batteries has been severely shortened.

It can therefore be appreciated that a method or apparatus to make this transportable data storage process reliable and which also prevents severe degradation of the lithium batteries would be highly desirable.

SUMMARY OF THE INVENTION

It is therefore an object of this invention to provide a means of reliably utilizing a battery backed up semiconductor memory circuit in a transportable module.

It is also an object of this invention to permit the use of battery backed up semiconductor memories in transportable modules without adversely affecting the life of the backup battery or batteries.

As shown in an illustrative embodiment of the invention, a transportable module includes a volatile memory, a power backup battery, and a connector which is configured to make a connection with at least one of the external primary power supply voltages before any of the signal connections are made to the module.

In a further aspect of the illustrative embodiment, the connector is preferably configured as a plurality of card edge pins comprising metallic traces on a portion of a printed circuit board inside the module, which card edge pins are arranged to be inserted into a female card edge connector of an external circuit, and which female card edge connector contains a like plurality of spring contacts which press against the metal traces to make electrical contact between the module and the external circuit. For connecting a power supply reference voltage from the external circuit to the module, at least one of the card edge pin metallic traces used for connecting the power supply reference voltage is fabricated to extend farther than the other traces such that the chosen trace makes contact with the spring contact in the female card edge connector before the other traces make contact with their respective spring contacts, thereby ensuring that a predetermined power supply reference voltage is applied to the module before signal connections are made between the module and the external circuit.

Also described as an illustrative embodiment of the invention is a method for connecting an electronic module containing a backup battery to another circuit comprising the step of making at least one power supply reference voltage connection between the module and the other circuit prior to making any of the signal connections between the module and the other circuit.

BRIEF DESCRIPTION OF THE DRAWINGS

The aforementioned and other features, characteristics, advantages, and the invention in general, will be better understood from the following more detailed description when taken in conjunction with the accompanying drawing in which:

The Sole FIGURE is a partial break-away view of a module and its mating female card edge connector in accordance with the present invention.

It will be appreciated that for simplicity and clarity of explanation the sole FIGURE has not necessarily been drawn to scale.

DETAILED DESCRIPTION OF THE PREFERRED EMBODIMENT

The failure described in the Background of the Invention has been analyzed, but a completely definitive reason for the loss of data and the shortened life of the battery has not been determined. It is theorized, however, that the loss of data and degradation of the battery is caused by a transitory condition which intermittently occurs when the module is inserted into the female card edge connector of an external circuit. During this transitory condition, the backup battery is shorted or partially shorted, resulting in the loss of the backup supply voltage used to preserve the data in each of the volatile semiconductor memory cells, and thus, depending upon the amount and duration of the voltage loss, causing some if not all of the cells to lose their data. Also, the lithium battery is designed to provide a low amount of current for a relatively long period of time. This period of time, however, is severely shortened if the battery is shorted for even a brief period. Thus, the malfunctions described are consistent with a temporary short or low impedance across the battery.

The exact mechanism causing the short has not been identified. Included in the module is a voltage controller circuit which is fabricated with CMOS integrated circuit processing technology wherein P-type wells are disposed in an N-type substrate. N-channel transistors are disposed in the P-type wells and P-channel transistors are disposed in the N-type substrate. The negative terminal of the lithium backup battery is connected to P-type wells and is defined as being the ground terminal of the module. The positive terminal of the battery is connected to a switching circuit of the CMOS integrated circuit which in turn couples the backup supply voltage to the memory cells during the time that the primary power supply voltage is not applied to the module. The memory cells can be embodied either in one or more separate integrated circuits or in the same integrated circuit as the voltage controller circuit.

It is believed that a bipolar transistor action is created in the voltage controller CMOS integrated circuit by the application of external signal voltages from the external circuitry to signal inputs and/or outputs of the CMOS integrated circuit prior to making connection to the CMOS integrated circuit of any of the external primary power supply voltages. This transistor action would, according to this theory, cause a short or low impedance across the battery.

Although the exact cause of the failure mechanism has not been identified, the failure has been eliminated by controlling the connection and disconnection sequence of a primary supply voltage terminal with respect to the signal terminals. As shown in the sole FIGURE a module 10 includes a printed circuit board 12 housed in a plastic case 14. Mounted on the printed circuit board 10 are a static random access memory integrated circuit 16, a CMOS voltage controller integrated circuit 18, and a lithium power backup battery 20. The integrated circuit 16 may consist, for example, of a 16K×8 memory integrated circuit such as part number TC5564PL-15 manufactured by Toshiba. The integrated circuit 18 may consist, for example, of a Nonvolatile Controller/Decoder integrated circuit such as part number DS1221 manufactured by Dallas Semiconductor Corporation. The lithium power backup battery 20 may consist, for example, of a 3 volt battery such as part number BR2325 manufactured by Ray-O-Vac.

The integrated circuit 18 compares the incoming primary power supply voltage (which should typically be at +5.0 volts, plus or minus 5 percent) to the backup battery voltage, and couples whichever voltage is of greater value to the VCC power supply terminal of the memory integrated circuit 16.

Also shown in the sole FIGURE as an extension of the printed circuit board 12 is a connector 22. The connector 22 is accessible from an opening in the plastic case 14 and consists of a plurality of metallic connection traces 24 which are typically wider than a number of conventional interconnection traces 26 on the printed circuit board 12 which provide interconnections between the integrated circuits 16 and 18, the power backup battery 20, and the connector 22. The metallic traces 24 are conventionally referred to as card edge pins and are dimensioned to mate with a female card edge connector 28 which contains a like plurality of spring contacts 30. It will be understood that attached to, and in electrical contact with, the card edge connector 28 is a separate external circuit 29 partially shown in the sole FIGURE. The external circuit 29 provides power supply voltages to the module 10 and transfers information to and from the module 10 via electrical signals. In the preferred embodiment shown, the connector 22 has metallic connection traces on both sides of the printed circuit board 12; and, the card edge connector 28 has spring contacts for making electrical connections to the metallic connection traces on both sides of the connector 22.

Of special significance to the present invention is the length of the metallic connection traces 24 on the connector 22. Specifically, the metallic connection traces for connecting the power supply voltages to the module 10, shown as metallic connection traces 32 and 34, are more extended than the metallic interconnecting traces used to connect electrical signals to and/or from the module 10. The trace 32 connects the primary power supply ground reference voltage (GND) to the module 10, and the trace 34 connects the primary power supply postive voltage terminal (VCC) to the module 10. In the preferred embodiment the spring contacts 30 of the card edge connector 28 are all of equal length.

In operation, when the module 10 is inserted into the card edge connector 28, the metallic connection traces 32 and 34 make physical and electrical contact with their respective spring contacts 30 before the other metallic connection traces are contacted. Similarly, when the module 10 is disconnected from the card edge connector 28, the metallic connection traces 32 and 34 remain in electrical contact with their respective spring contacts 30 after the other metallic connection traces have been disconnected from their respective spring contacts. In this manner the electrical signal voltages are never connected between the module 10 and the external circuit 29 unless the power supply voltages are also connected. Tests have shown that the aforementioned problems of data loss and shortened battery life are obviated by the use of the embodiment just described.

Testing has also shown that making only the metallic trace associated with the primary power supply ground reference voltage extend more than the other metallic traces is sufficient to prevent the problems of data loss and shortened battery life. Likewise, testing has further shown that making only the metallic trace associated with the primary power supply positive voltage terminal extend more than the other metallic traces is also sufficient.

Although the invention has been described in part by making detailed reference to a certain specific embodiment, such detail is intended to be and will be understood to be instructive rather than restrictive. It will be appreciated by those skilled in the art that many variations may be made in the structure and mode of operation without departing from the spirit and scope of the invention disclosed in the teachings contained herein. For example, other connection apparatus can be used with the present invention. Moreover, electrical circuitry could be included in either the module or the external circuit which would prevent application of electrical signals to the integrated circuits of the module either until after one or more primary power supply voltage connections are made to the module.

What is claimed is:

1. An apparatus for storing electronic data, which can be disconnected from an external circuit and reconnected again without losing data and without receiving external electrical power, comprising:
   a memory;
   a power supply;
   a voltage controller circuit, which, selectively,
     connects power from an external source to said memory, or
     connects backup electrical power from said battery to said memory for retaining said electronic data in said memory when power from the external source is interrupted;
   connection means for mating with the external circuit to provide power and logic signal connections between the apparatus and the external circuit; and said connection means including conductive traces of unequal length, disposed in a mechanical sequencing relation which causes at least one of the power connections to be physically made before any of the logic connections are physically made.

2. An apparatus for storing electronic data, which can be disconnected from an external circuit and reconnected again without losing data and without receiving external electrical power, comprising:

means for providing backup electrical power for retaining said electronic data when the primary power from an external source is interrupted; and connection means for mating with the external circuit to provide power and logic signal connections between the apparatus and the external circuit;

said connection means including a sequencing relation which causes at least one of the power connections to be made before any of the logic connections are made;

wherein said connections means is a mechanical connector which can mate with a mechanical connector attached to the external circuit, and wherein said sequencing relation is provided by variation in the lengths of the connecting members, such that when the apparatus connector and the external circuit connector are mated together, at least a predetermined on of the mating power connections is made before any of the mating logic connections is made.

3. Apparatus as set forth in claim 2, wherein said predetermined one of the mating power connections is connected to provide a reference voltage to at least one CMOS integrated circuit which receives said backup electrical power.

4. Apparatus as set forth in claim 2, wherein said connector of said apparatus is male type, and said variation in the lengths of the connecting members consists of longer male connecting members for at least one of the power connections as compared to the lengths of the connecting members for said logic connections.

5. An apparatus for storing electronic data, which can be disconnected from an external circuit and reconnected again without losing data and without receiving external electrical power, comprising:

a memory;

a backup electrical power source, connected to provide power to said memory when the primary power from an external source is interrupted; a connector, including conductive traces having unequal lengths, shaped to mate with a predetermined connector configuration of the external circuit, to provide power and logic signal connections between the apparatus and the external circuit, and shaped to provide a predetermined sequence of physical connections such that, when said connector is mated with said predetermined connector configuration, at least a predetermined one of the power connections will always be made before any of the logic connections are made.

6. The apparatus of claim 6, wherein said connector comprises conductive traces which extend to unequal distances from an edge of said connector.

7. The apparatus of claim 6, wherein said memory comprises an SRAM integrated circuit.

8. The apparatus of claim 6, wherein said backup power source consists essentially of a battery.

9. The apparatus of claim 6, wherein said connector includes plural conductive traces, and exactly two of said traces are longer than all others of said traces.

10. The apparatus of claim 6, wherein said connector includes plural conductive traces, and exactly one of said traces is longer than all others of said traces.

11. The apparatus of claim 6, wherein said connector includes plural card edge pins, dimensioned to mate with a female card edge connector.

* * * * *